United States Patent
Lai et al.

(10) Patent No.: US 10,903,258 B2
(45) Date of Patent: Jan. 26, 2021

(54) IMAGE SENSORS WITH GROUNDED OR OTHERWISE BIASED CHANNEL-STOP CONTACTS

(71) Applicant: KLA-Tencor Corporation, Milpitas, CA (US)

(72) Inventors: Tzi-Cheng Lai, San Jose, CA (US); Jehn-Huar Chern, Morgan Hill, CA (US); Stephen Biellak, Sunnyvale, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/153,495

(22) Filed: Oct. 5, 2018

(65) Prior Publication Data

US 2019/0109163 A1 Apr. 11, 2019

Related U.S. Application Data

(60) Provisional application No. 62/593,599, filed on Dec. 1, 2017, provisional application No. 62/593,616, filed on Dec. 1, 2017, provisional application No. 62/571,111, filed on Oct. 11, 2017.

(51) Int. Cl.
  *H01L 27/146* (2006.01)
  *H01L 27/148* (2006.01)

(52) U.S. Cl.
  CPC .... *H01L 27/1464* (2013.01); *H01L 27/14609* (2013.01); *H01L 27/14806* (2013.01); *H01L 27/14812* (2013.01); *H01L 27/14831* (2013.01)

(58) Field of Classification Search
  CPC ................. H01L 27/14806–14818; H01L 27/14601–14616; H01L 27/1464
  See application file for complete search history.

(56) References Cited

U.S. PATENT DOCUMENTS

| | | |
|---|---|---|
| 6,259,085 B1 | 7/2001 | Holland |
| 7,126,100 B1 | 10/2006 | Chuang et al. |
| 8,592,245 B2 | 11/2013 | Janesick |
| 8,912,495 B2 | 12/2014 | Lange |

(Continued)

FOREIGN PATENT DOCUMENTS

| | | | |
|---|---|---|---|
| JP | 2006073736 A | | 3/2006 |
| JP | 2006100620 | * | 4/2006 |
| JP | 2006100620 A | | 4/2006 |

OTHER PUBLICATIONS

English Machine Translation of JP 2006-100620, Translated on Nov. 10, 2019 (Year: 2019).*

(Continued)

*Primary Examiner* — Amar Movva
(74) *Attorney, Agent, or Firm* — Huse IP Law; Charles C. Huse

(57) ABSTRACT

A back-illuminated image sensor includes a first pixel, a second pixel, and a channel stop situated between the first pixel and the second pixel to isolate the first pixel from the second pixel. The channel stop includes a LOCOS structure and a region of doped silicon beneath the LOCOS structure. The back-illuminated image sensor also includes a first electrically conductive contact that extends through the LOCOS structure and forms an ohmic contact with the region of doped silicon. The first electrically conductive contact may be grounded, negatively biased, or positively biased, depending on the application.

23 Claims, 7 Drawing Sheets

(56) References Cited

U.S. PATENT DOCUMENTS

| | | |
|---|---|---|
| 9,484,373 B1 | 11/2016 | Chen et al. |
| 2005/0255625 A1 | 11/2005 | Janesick et al. |
| 2007/0064135 A1 | 3/2007 | Brown et al. |
| 2007/0131987 A1 | 6/2007 | Kim |
| 2014/0247380 A1* | 9/2014 | Hynecek ............ H01L 27/1461 348/299 |
| 2015/0146029 A1* | 5/2015 | Venkataraman ..... H04N 5/3696 348/218.1 |

OTHER PUBLICATIONS

PCT/US2018/055328, International Search Report, dated Feb. 1, 2019.

PCT/US2018/055328, Written Opinion of the International Searching Authority, dated Feb. 1, 2019.

Armin Karcher et al., "Measurement of Lateral Charge Diffusion in Thick, Fully Depleted, Back-Illuminated CCDs," IEEE Transactions on Nuclear Science, vol. 51, No. 5, pp. 2231-2237, Oct. 2004.

James R. Janesick et al., "High-Speed Scientific CCDs: Substrate Bounce," Proc. SPIE 4008, Optical and IR Telescope Instrumentation and Detectors, pp. 375-388, Aug. 16, 2000.

Ricardo E. Schmidt, "On the Optimization of CCD Readout Noise," Optical Detectors for Astronomy (J.W. Beletic and P. Amico eds.), pp. 245-250, 1998, Kluwer Academic Publishers.

Stephen E. Holland et al., "Device Design for a 12.3 Megapixel, Fully Depleted, Back-Illuminated, High-Voltage Compatible Charge-Coupled Device," IEEE Transactions on Electron Devices, vol. 56, No. 11, pp. 2612-2622, Nov. 2009.

Stephen E. Holland et al., "Fully-Depleted, Back-Illuminated Charge-Coupled Devices Fabricated on High-Resistivity Silicon," IEEE Transactions on Electron Devices, vol. 50, No. 1, pp. 225-238, Jan. 2003.

* cited by examiner

IMAGE SENSORS WITH GROUNDED OR OTHERWISE BIASED CHANNEL-STOP CONTACTS

RELATED APPLICATION

This application claims priority to U.S. Provisional Patent Application No. 62/571,111, filed Oct. 11, 2017, titled "Novel Approach to Ground Return for Back-Illuminated Imager Sensors"; 62/593,599, filed Dec. 1, 2017, titled "Adjustable Modulation-Transfer-Function (MTF) Through Top Contacts to LOCOS for Back-Illuminated Imager Sensors"; and 62/593,616, filed Dec. 1, 2017, titled "Multi-Spectral Inspection System From DUV To Near IR With Adjustable Modulation-Transfer-Function (MTF) Using Back-Illuminated Imager Sensors," which applications are hereby incorporated by reference in their entirety for all purposes.

TECHNICAL FIELD

This disclosure relates to image sensors, and more specifically to back-illuminated image sensors in which channel stops between pixels may be grounded or otherwise biased.

BACKGROUND

One challenge in designing back-illuminated image sensors is dealing with the weak alternating-current (AC) ground return in the photo-sensitive area (i.e., the pixel array). For example, a time-domain integration (TDI) charge-coupled device (CCD) image sensor may use multi-phased clock signals to clock the vertical registers of the pixel array. Lack of an adequate AC ground return can cause imbalances in the multi-phased clock signals to feed through to the readout amplifiers, which sense the feedthrough before it reaches ground. This feedthrough increases with vertical frequency (i.e., with line rate) and results in a direct-current (DC) offset (i.e., dark offset) for pixels that impairs system performance.

Another challenge is aliasing, which refers to artifacts introduced into an image through the sampling process. Aliasing causes the sampled image to differ from the target being imaged. For example, it may be desirable to maximize the amount of light on an image sensor, to increase the signal-to-noise ratio and to increase imaging speed and throughput (e.g., in the context of semiconductor inspection). However, magnifications that increase the amount of light on the image sensor may result in aliasing. Aliasing may be mitigated by degrading the modulation transfer function (MTF), which is a measure of the contrast at which different spatial frequencies are transferred to an image. The governing equation for MTF in an imaging process is:

$$MTF_{image}=MTF_{optical}*MTF_{diffusion}*MTF_{array}*MTF_{processing} \quad (1)$$

where $MTF_{optical}$ is the MTF of the imaging-system optics, $MTF_{diffusion}$ is the MTF of the sensor diffusion as defined by the charge from a single pixel that leaks into adjacent pixels, $MTF_{array}$ is the MTF created by the discrete nature of pixel sampling, and $MTF_{processing}$ is the MTF of image processing subsequent to image formation by the image sensor. Per equation 1, any of these factors can be degraded to degrade the overall $MTF_{image}$ and thus reduce or avoid aliasing. Techniques for MTF degradation, however, have significant side effects and may be impractical. $MTF_{optical}$ may be reduced by altering the imaging-system optics, but such alterations are often impractical because they discard light energy and thus reduce throughput, modify the light used to illuminate the image sensor in a manner that impedes imaging, and/or complicate the design of the optics. Algorithms for altering $MTF_{processing}$ are generally impractical because artifacts are typically indistinguishable from true image details. $MTF_{array}$ may be degraded by combining pixels, which tends to produce unacceptable results. $MTF_{diffusion}$ may be degraded by adjusting the amplitude of the clock signals that bias gates in the sensor array, which modifies the depletion depth of the active region. While effective, this technique reduces the pixel full-well capacity. Accordingly, improved techniques for degrading $MTF_{image}$ are needed.

Yet another challenge is how to implement multi-spectral imaging. It may be desirable to use a single imaging system to performing imaging across a range of wavelengths (e.g., from ultraviolet to infrared). Typical photon-penetration depths vary strongly as a function of wavelength, however. The typical photon-penetration depth at 405 nm is approximately 0.1 to 0.2 um, at 650 nm is approximately 3 um, and at 900 nm is approximately 10 um. In the deeper portions of the ultraviolet (UV), for example between 190 nm and 300 nm, the photon-penetration depth is less than 0.01 um. This strong variation complicates the question of what substrate thickness to use for a multi-spectral imaging sensor. (The substrate of a back-illuminated image sensor is thinned to a specified thickness, in accordance with the wavelength or range of wavelengths to be used in the case of non-multi-spectral imaging.) When the substrate is too thin, it becomes semi-transparent at longer wavelengths (e.g., in the near infrared). It is desirable to increase the substrate thickness with increasing wavelength, to improve quantum efficiency (i.e., the rate at which photons produce electron/hole pairs). Increasing the substrate thickness, however, degrades the MTF at lower wavelengths by significantly increasing the depletion-free region in the substrate. This MTF degradation may result in poor imaging quality at shorter wavelengths when the substrate is thick enough to allow for imaging at longer wavelengths.

SUMMARY

The above challenges may be addressed by providing contacts that extend through the LOCOS (an oxide formed by localized oxidation of silicon) of channel stops separating pixel columns, to allow the doped regions beneath the LOCOS in the channel stops to be grounded, negatively biased, and/or positively biased. (An oxide structure fabricated using the LOCOS process is referred to as LOCOS in the art). Grounding the channel-stop contacts, and thus the doped regions beneath the LOCOS, provides an AC ground return that prevents feedthrough produced by clock-signal imbalances from affecting the readout amplifiers and degrading performance. Negatively biasing the channel-stop contacts, and thus the doped regions beneath the LOCOS, degrades $MTF_{diffusion}$ and thus mitigates aliasing. Positively biasing the channel-stop contacts, and thus the doped regions beneath the LOCOS, improves $MTF_{diffusion}$ and thus allows imaging to be performed at shorter wavelengths even when the image-sensor substrate is thick enough to support imaging at longer wavelengths.

In some embodiments, a back-illuminated image sensor includes a first pixel, a second pixel, and a channel stop situated between the first pixel and the second pixel to isolate the first pixel from the second pixel. The channel stop includes a LOCOS structure and a region of doped silicon beneath the LOCOS structure. The back-illuminated image sensor also includes a first electrically conductive contact that extends through the LOCOS structure and forms an ohmic contact with the region of doped silicon.

In some embodiments, a method of fabricating a back-illuminated image sensor includes fabricating first and second columns of pixels and fabricating a channel stop situated between the first and second columns of pixels, to isolate the first column of pixels from the second column of pixels. Fabricating the channel stop includes doping a region of silicon and forming a LOCOS structure above the doped region of silicon. The method further includes etching an opening through the LOCOS structure and depositing an electrically conductive material in the opening to form an electrically conductive contact comprising an ohmic contact with the doped region of silicon beneath the LOCOS structure.

In some embodiments, an imaging method includes illuminating an imaging sensor with light reflected from a target. In the imaging sensor, while illuminating the imaging sensor, time-domain integration (TDI) is performed along a plurality of pixel columns comprising pairs of pixel columns separated by respective channel stops. The channel stops comprise respective LOCOS structures and respective regions of doped silicon beneath the respective LOCOS structures. Electrically conductive contacts extend through the LOCOS structures and form ohmic contacts with the regions of doped silicon of the plurality of channel stops. While illuminating the imaging sensor and performing TDI, the electrically conductive contacts are biased.

BRIEF DESCRIPTION OF THE DRAWINGS

For a better understanding of the various described implementations, reference should be made to the Detailed Description below, in conjunction with the following drawings.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1A:
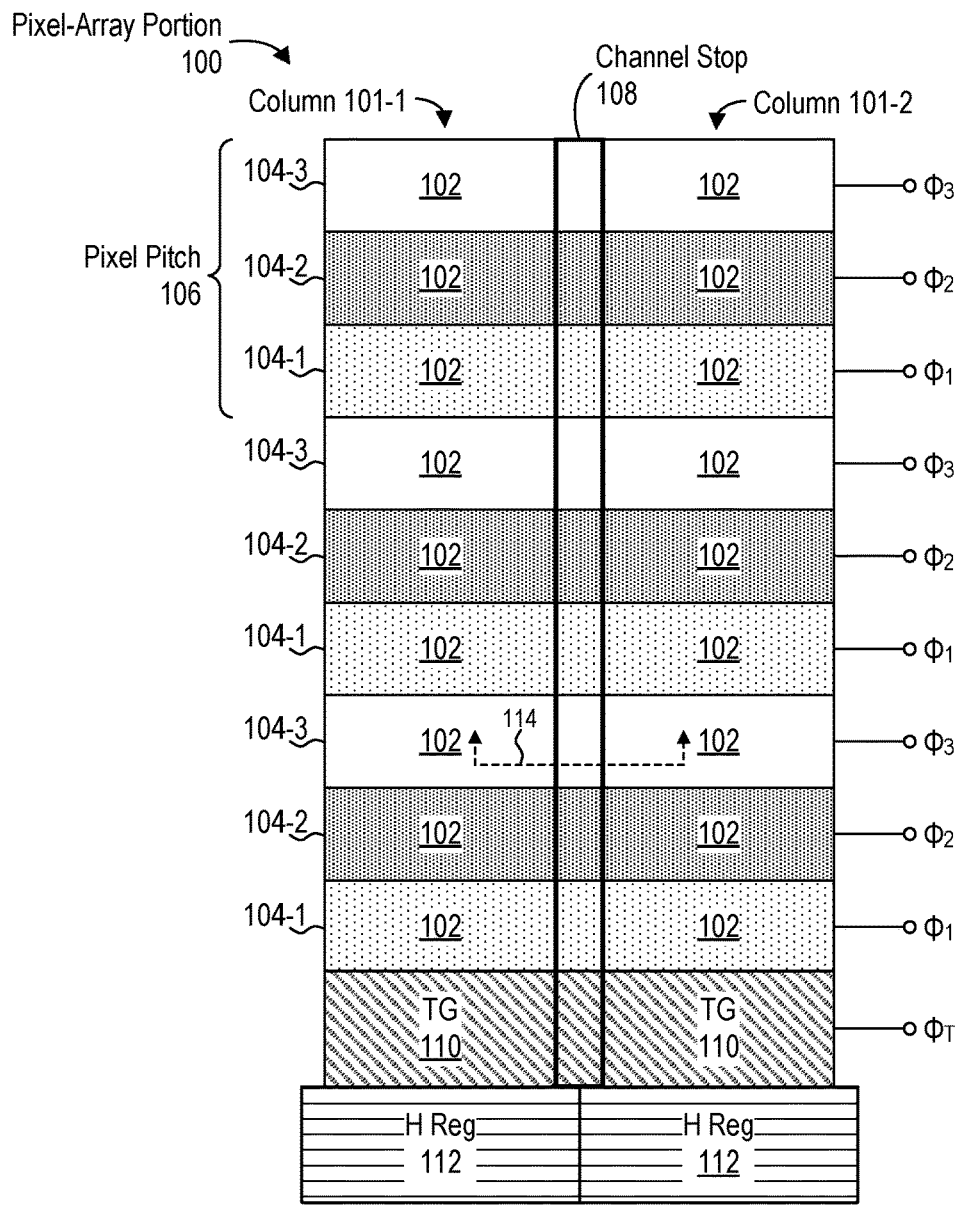
FIG. 1A is a plan view of a portion of a pixel array in an image sensor.

FIG. 1A is a plan view of a portion 100 of a pixel array in an image sensor. The portion 100 includes a pair of pixel columns 101-1 and 101-2 and an intervening channel stop 108. The full pixel array includes a repeating sequence of pairs of pixel columns 101 with respective intervening channel stops 108 between the pixel columns 101 of each pair. Each pair of pixel columns 101 may be separated from the next pair of pixel columns 101 by another channel stop 108 or by an anti-blooming structure (e.g., an anti-blooming drain surrounded by a pair of anti-blooming gates, all extending in the direction of the pixel columns 101).

Figure 1B:
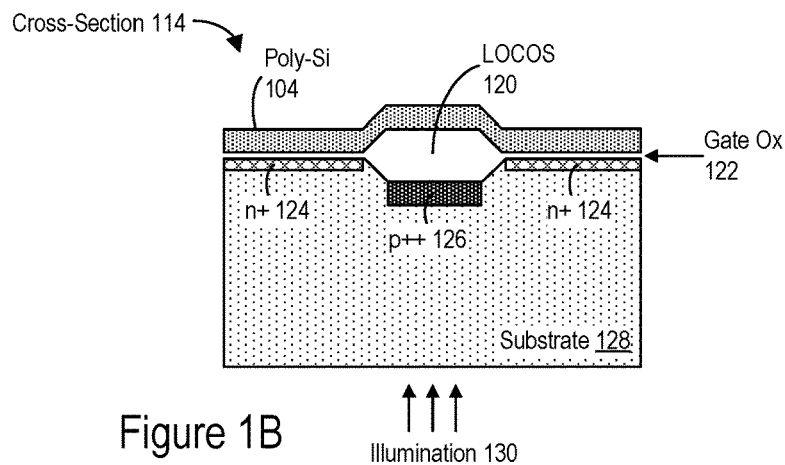
FIG. 1B shows a cross-section of two gates and an intervening channel stop in the pixel-array portion of FIG. 1A.

Each pixel column 101 includes a vertical series of gates 102. The channel stop 108 stops charge from leaking to horizontally adjacent gates 102 (i.e., from a gate 102 in the first column 101-1 to an adjacent gate 102 in the second column 101-2, and vice-versa). The gates 102 are fabricated using stripes 104 of electrically conductive polysilicon ("poly-Si" or simply "poly") that extend across the columns 101 and intervening channel stops 108. (Gate fabrication is discussed further below with respect to FIG. 1B). Each polysilicon stripe 104 is electrically isolated from adjacent polysilicon stripes 104 (e.g., each polysilicon stripe 104-2 is electrically isolated from adjacent polysilicon stripes 104-1 and 104-3, and likewise for each polysilicon stripe 104-1 and 104-3). Each polysilicon stripe 104 is biased using a clock signal 1. In the example of FIG. 1, each polysilicon stripe 104-3 is biased by a clock signal $\Phi$, each polysilicon stripe 104-2 is biased by a clock signal 12, and each polysilicon stripe 104-1 is biased by a clock signal $\Phi_1$. The clock signals $\Phi_1$, $\Phi_2$, and $\Phi_3$ applied to successive polysilicon stripes 104 have respective phases that are offset from each other (e.g., by 120°). When the pixel array is illuminated, charge accumulates under respective gates 102, in accordance with the biasing. The phase offsets of the clock signals $\Phi_1$, $\Phi_2$, and $\Phi_3$ result in accumulated charge being transferred from gate 102 to gate 102 along each pixel column 101 until the charge reaches a transfer gate 110 at the end of the pixel column 101. The transfer gate 110, which is biased by a clock signal $\Phi_T$, transfers the charge from the last gate 102 in a column to a respective horizontal register 112. Charge is then transferred horizontally between successive horizontal registers 112 to a readout amplifier (not shown), which senses the charge.

A sequence of gates 102 that receive the full set of clock signals $\Phi_1$, $\Phi_2$, and $\Phi_3$ in a pixel column 101 is defined as a pixel, with a vertical pixel pitch 106. In the example of FIG. 1, there are three clock signals $\Phi_1$, $\Phi_2$, and $\Phi_3$, and a pixel therefore includes three successive gates 102. In other examples, there may be only two clock signals or four or more clock signals with respective phases (e.g., offset by a number of degrees equal to 360° divided by the number of clock signals), and the number of successive gates 102 in a pixel equals the number of clock signals and thus the number of respective phases. The clock signals may be sinusoidal.

FIG. 1B shows a cross-section 114 of two gates 102 and an intervening channel stop 108. Each gate 102 includes a gate oxide 122 situated beneath a polysilicon stripe 104 and above a region 124 doped n-type (e.g., n+). The channel stop 108 includes LOCOS (i.e., a LOCOS structure) 120 and a region 126 beneath the LOCOS 120 that is doped p-type. For example, the dopant concentration of the region 126 may be p++ (e.g., greater than 1e18 cm-3) or p+ (e.g., between 1e17 cm-3 and 1e18 cm-3). The regions 124 and 126 and the LOCOS 120 are formed on a substrate 128, which may be an epitaxial silicon layer (an "epi-layer") grown on bulk silicon, with the bulk silicon subsequently being polished off to allow for back-side illumination 130. The substrate 128 may be p-type (e.g., near-intrinsic p-type). The dopant concentration of the region 126 is thus significantly higher (e.g., by several orders of magnitude) than the dopant concentration of the substrate 128. While the region 124 is described as n-type and the region 126 and substrate 128 are described as p-type, these dopant types may be reversed.

The region 126 may be connected to ground at the edge of or outside the pixel array but is otherwise floating, and thus offers at best a high-resistance path to ground. Providing electrically conductive contacts to the region 126 inside the pixel array, however, would provide an extra variable in the operation of an image sensor that would address the challenges described above. The region 126 could be grounded through the contacts to provide an AC ground return for feedthrough. The region 126 could also be positively or negatively biased through the contacts to modulate the depletion region in the substrate 128 and thereby enhance or degrade $MTF_{diffusion}$.

Figure 2:
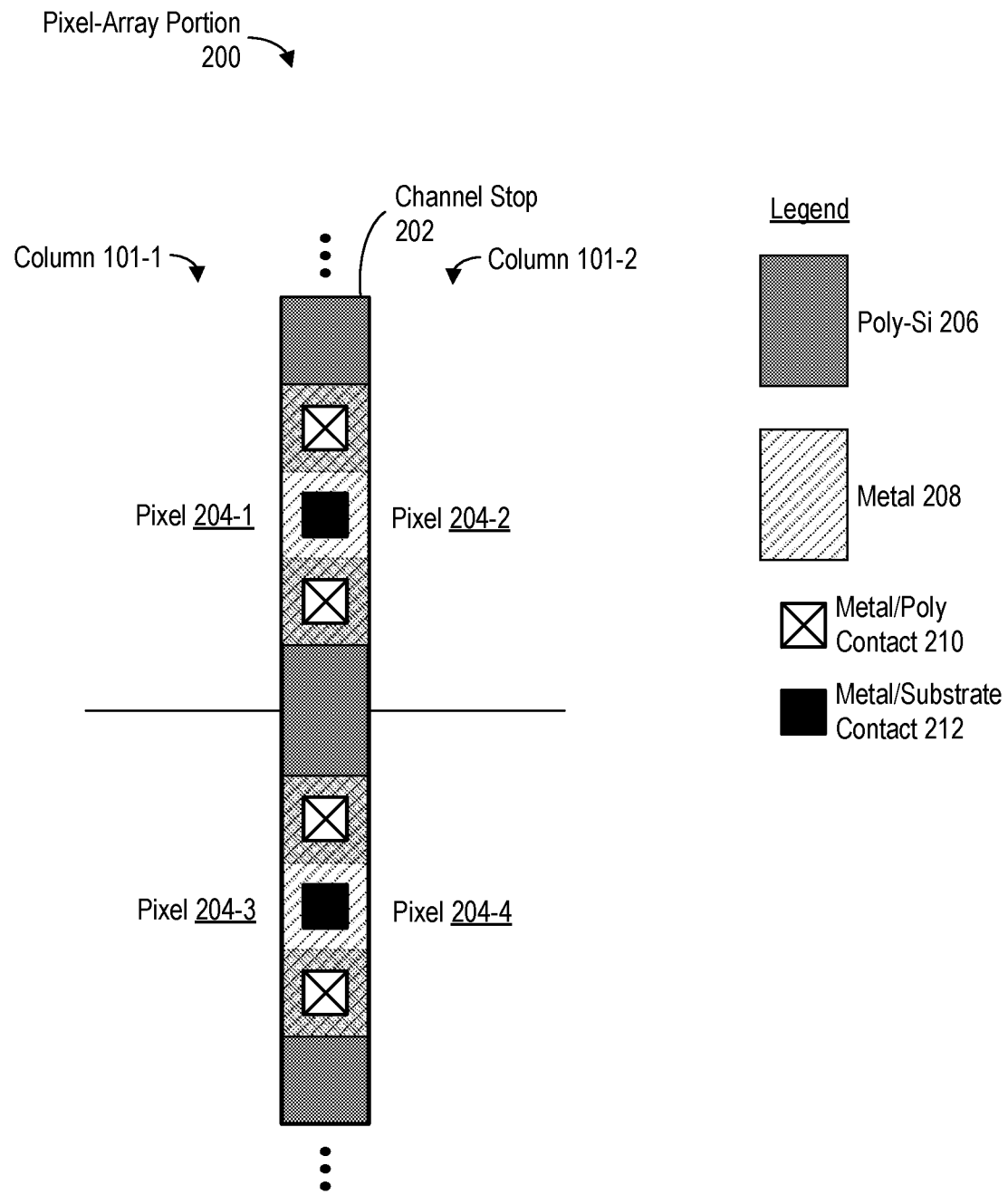
FIG. 2 is a plan view of a portion of a pixel array in an image sensor, in which a sequence of electrically connected polysilicon segments and overlapping metal segments overlay a channel stop, with the metal segments being electrically connected to a doped region of the channel stop through contacts, in accordance with some embodiments.

FIG. 2 is a plan view of a portion 200 of a pixel array in an image sensor in accordance with some embodiments. In the portion 200, a channel stop 202 with a structure similar to the channel stop 108 (FIGS. 1A-1B) isolates pixels 204-1 and 204-3 (and thus their corresponding gates 102) in the first pixel column 101-1 from respective adjacent pixels 204-2 and 204-4 (and their corresponding gates 102) in the adjacent second pixel column 101-2. In some embodiments (e.g., for 2 um design rules), the channel stop 202 has a width of 4-6 um and extends for a depth of 1-2 um with respect to the surface of the substrate 128.

An alternating sequence of electrically conductive polysilicon segments 206 and metal segments 208 overlay (i.e., are situated above and extend along the direction of) the channel stop 202, and thus are situated above the LOCOS 120 (FIG. 1B) of the channel stop 202. The metal segments 208 overlap respective polysilicon segments 206: each metal segment 208 overlaps previous and subsequent polysilicon segments 206 (except, e.g., at the top and bottom edges of the pixel array). The corresponding metal and polysilicon layers are separated by one or more dielectric layers. The polysilicon layer may be deposited directly on the LOCOS 120. Electrically conductive metal/poly contacts 210 extend between and electrically connect the metal segments 208 and their respective previous and subsequent polysilicon segments 206, thereby creating a conductor that extends along the channel stop 202. This conductor comprises the polysilicon segments 206, metal segments 208, and metal/poly contacts 210. Metal/substrate contacts 212 extend between and electrically connect respective metal segments 208 (e.g., each metal segment 208) and the region 126 (FIG. 1B) of the channel stop 202, and form respective ohmic contacts with the region 126. The metal/substrate contacts 212 thus extend through the LOCOS 120. The metal/substrate contacts 212 are formed beneath portions of the metal segments 208 that do not have polysilicon segments 206 directly underneath, in accordance with some embodiments.

In some embodiments, there are two metal/poly contacts 210 and one metal/substrate contact 212 per pixel (i.e., per adjacent pair of pixels). In some embodiments, there are two metal/poly contacts 210 and one metal/substrate contact 212 per n pixels (e.g., per $2^n$ pixels), where n may be an integer. For example, there may be two metal/poly contacts 210 and one metal/substrate contact 212 per n pixels, where n is an integer less than or equal to eight.

Figure 3A:
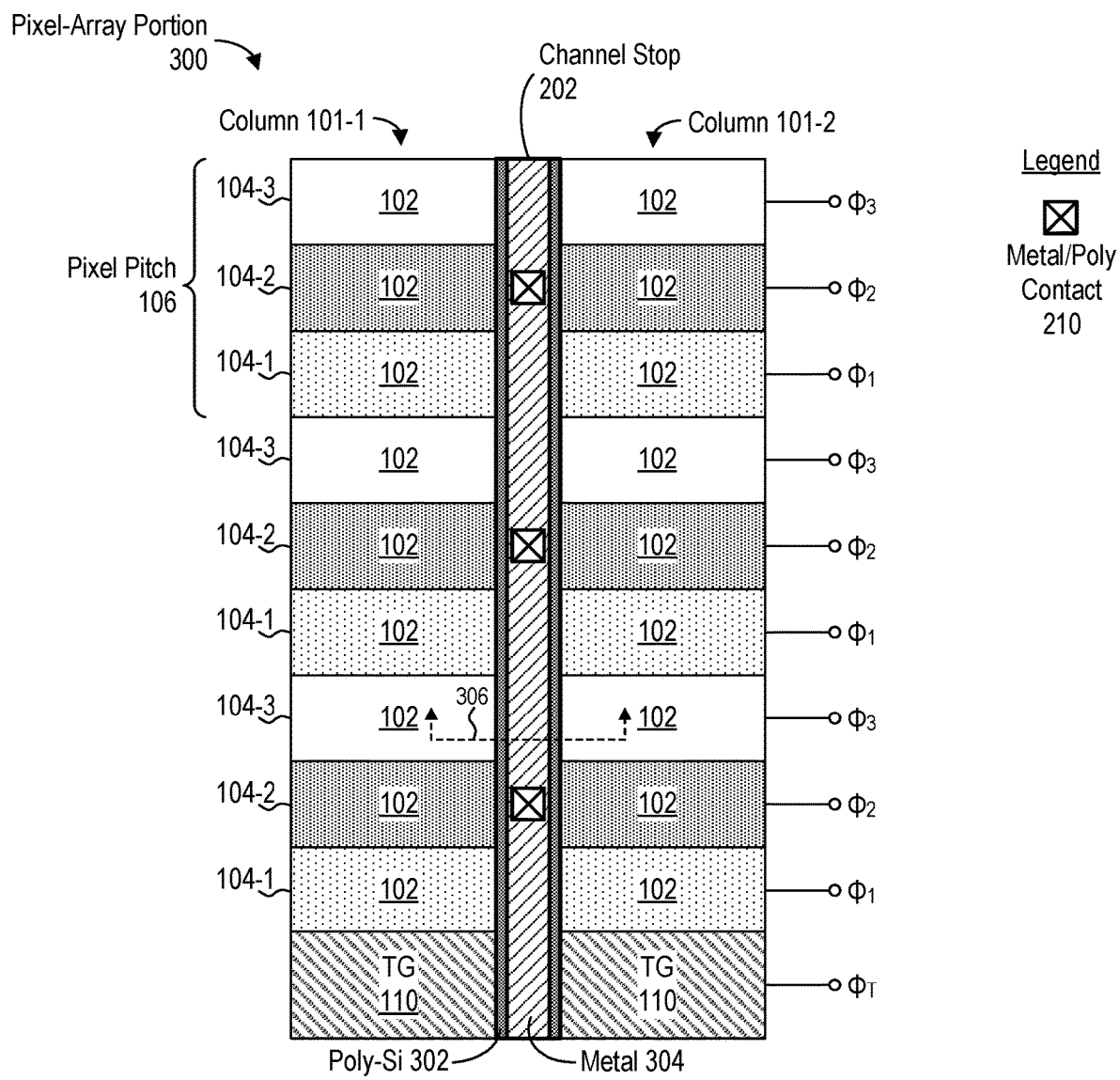
FIG. 3A is a plan view of a portion of a pixel array in an image sensor, in which a polysilicon line overlays and is electrically connected to a channel stop, and a metal line overlays and is electrically connected to the polysilicon line in accordance with some embodiments.
Figure 3B:
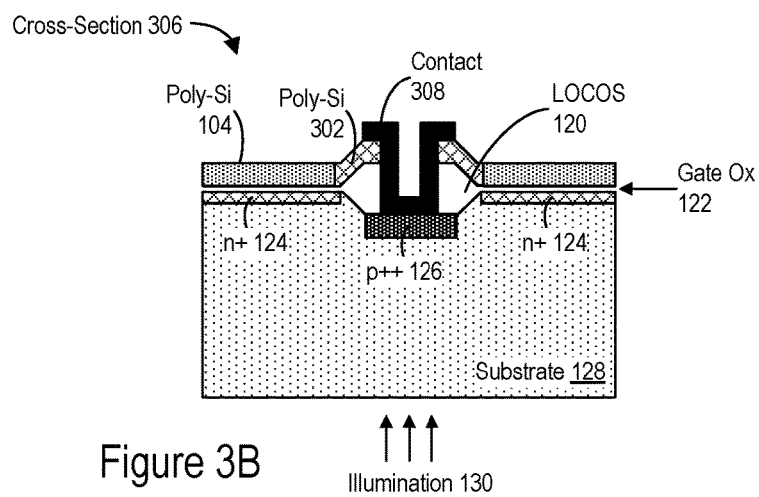
FIG. 3B shows a cross-section of two gates and an intervening channel stop in the pixel-array portion of FIG. 3A, in accordance with some embodiments.

FIG. 3A is a plan view of a portion 300 of a pixel array in an image sensor that is an alternative to the portion 200 (FIG. 2) in accordance with some embodiments. FIG. 3B shows a cross-section 306 of two gates 102 and the intervening channel stop 202 in the portion 300, in accordance with some embodiments. In the portion 300, an electrically conductive polysilicon line 302 is situated above and extends along the channel stop 202. An electrically conductive contact 308 extends through the polysilicon line 302 and LOCOS 120 to the region 126, as shown in the cross-section 306, and forms an ohmic contact with the region 126. The polysilicon line 302 is in contact with, and thus is electrically connected to, the contact 308. A metal line 304 is situated above and extends along the polysilicon line 302 and channel stop 202. As in the portion 200 (FIG. 2), the corresponding metal and polysilicon layers are separated by one or more dielectric layers. Metal/poly contacts 210 (e.g., a series of such contacts) extend between and electrically connect the polysilicon line 302 and metal line 304. Strapping the polysilicon line 302 to the metal line 304 in this manner provides a low-resistance connection from the contact 308 and region 126 to an external point of connection (e.g., to ground or to a power supply). In some embodiments, the metal line 304 is omitted and the connection from the contact 308 and region 126 to the external point of connection is through the polysilicon line 302.

In some embodiments, there is one contact 308 and/or one metal/poly contact 210 per pixel, multiple contacts 308 and/or multiple metal/poly contacts 210 per pixel (e.g., one per gate 102), or one contact 308 and/or one metal/poly contact 210 per n pixels (e.g., per $2^n$ pixels), where n may be an integer. For example, there may be one contact 308 and/or one metal/poly contact 210 per n pixels, where n is an integer less than or equal to eight.

As described with respect to FIG. 1A, a full pixel array may include a repeating sequence of pairs of pixel columns 101 with respective intervening channel stops 202 between the pixel columns 101 of each pair. Each channel stop 108 is thus one of a plurality of channel stops 108 that isolate the pixel columns 101 of respective pairs of pixel columns 101. Each pair of pixel columns 101 may be separated from the next pair of pixel columns 101 by another channel stop 202 or by an anti-blooming structure. A plurality of electrically conductive contacts 212 (FIG. 2) or 308 (FIG. 3B) extend through the LOCOS structures 120 and form ohmic contacts with the regions 126 of the channel stops 202.

Figure 4:
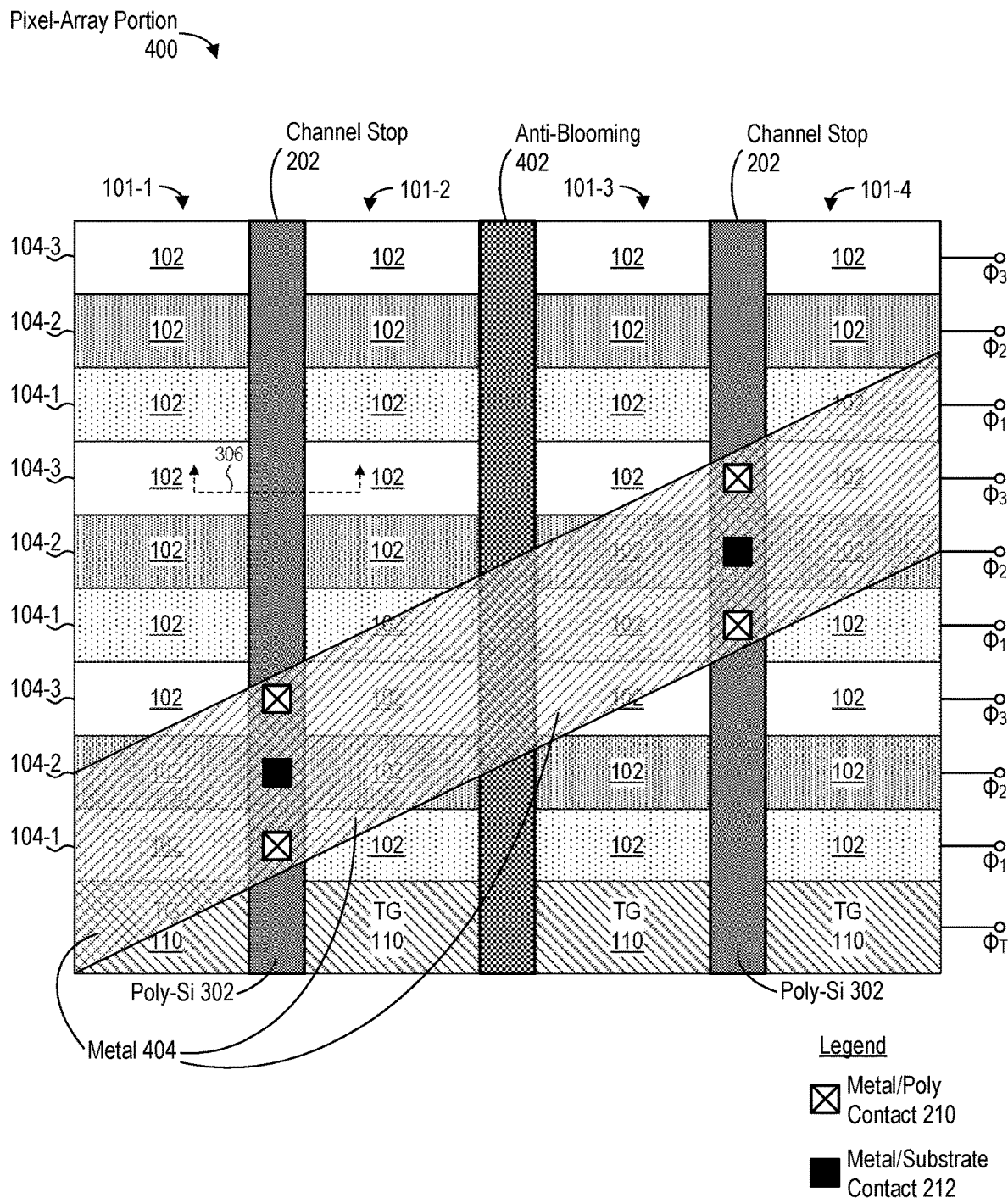
FIG. 4 is a plan view of a portion of a pixel array in which a metal line crosses a plurality of pairs of pixel columns at a slant and is electrically connected to corresponding channel stops, in accordance with some embodiments.

FIG. 4 is a plan view of a portion 400 of a pixel array in an image sensor in which a first pair of pixel columns 101-1 and 101-2 are separated from a second pair of pixel columns 101-3 and 101-4 by an anti-blooming structure 402 (or alternatively another channel stop), in accordance with some embodiments. These first and second pairs of pixel columns are part of a plurality of pairs of pixel columns in a pixel array, each with a respective channel stop 202 between the pixel columns 101 of the pair. A metal line 404 crosses above the plurality of pairs of pixel columns 101. In some embodiments, the metal line 404 is oriented at a slant with respect to the plurality of pairs of pixel columns 101. A plurality of metal/substrate contacts 212 extends between and electrically connect the metal line 404 and regions 126 of the channel stops 202. In some embodiments, polysilicon lines 302 are situated above and extend along respective channel stops 202, and metal/poly contacts 210 extend between the metal line 404 and the polysilicon lines 302. The metal line 404 may be used (e.g., in conjunction with the polysilicon lines 302) to ground, negatively bias, and/or positively bias the metal/substrate contacts 212 and regions 126.

Figure 5A:
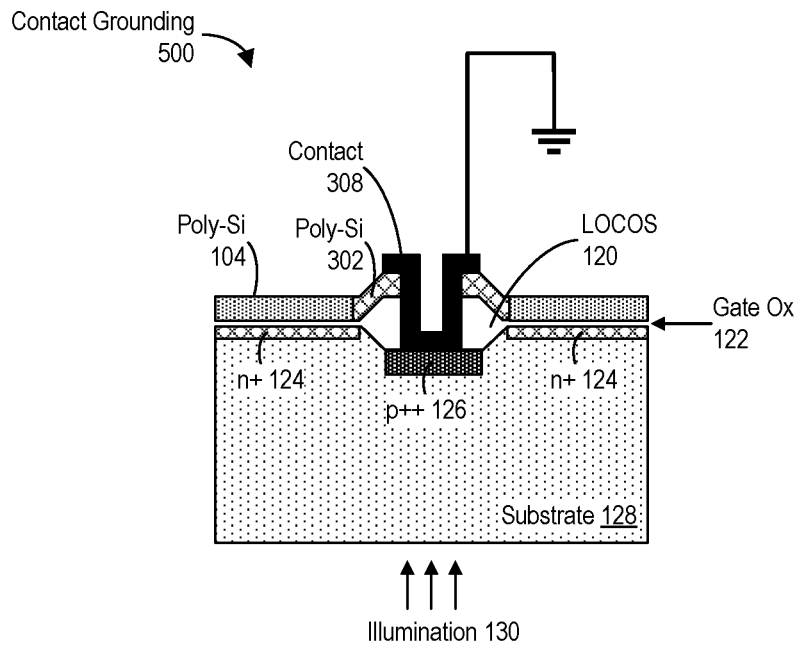
FIG. 5A is a schematic illustration showing the grounding of a channel-stop contact in accordance with some embodiments.

FIG. 5A is a schematic illustration showing the grounding 500 of a contact 308 in accordance with some embodiments. The contact 308 may be connected to ground through the polysilicon line 302, metal/poly contacts 210, and/or metal line 304 (FIG. 3A), as well as metal lines in the periphery of the sensor chip that includes the pixel array. Similarly, a metal/substrate contact 212 may be connected to ground through the conductive structures shown in FIGS. 2 and 4, as well as metal lines in the periphery of the sensor chip that includes the pixel array. Grounding such contacts provides a ground return that prevents feedthrough caused by unbalance clock signals from affecting the readout amplifiers. Imaging performance is thus improved and imaging can be performed at higher line rates than would otherwise be possible. Grounding such contacts may also provide other benefits, such as reducing plasma-induced charge damage during fabrication and thus improving yield, reducing mechanical stress, and enhancing MTF by improving operation of the channel stop.

Figure 5B:
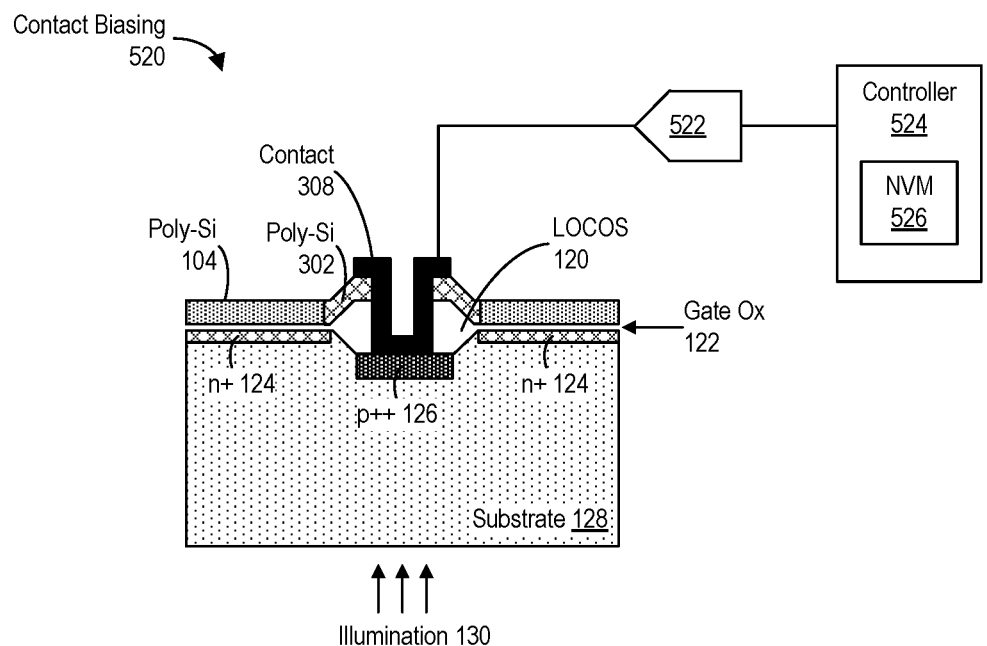
FIG. 5B is a schematic illustration showing the biasing of a channel-stop contact in accordance with some embodiments.

FIG. 5B is a schematic illustration of the positive and/or negative biasing of a contact 308 in accordance with some embodiments. The contact 308 or a metal/substrate contact 212 is electrically connected to a programmable power supply 522 (e.g., a digital-to-analog converter (DAC)), for example through one of the conductive structures shown in FIGS. 2, 3A, and 4 as well as metal lines in the periphery of the sensor chip that includes the pixel array. In some embodiments, the power supply 522 is controlled by a controller 524 (e.g., a microcontroller or FPGA), which provides digital signals to the power supply 522 specifying the bias voltage to be provided by the power supply 522. This bias voltage may vary as a function of the imaging wavelength(s), the target being imaged, and/or other factors (e.g., whether the imaging is brightfield or darkfield). In some embodiments, the controller 524 includes non-volatile memory 526 that includes a non-transitory computer-readable medium storing instructions, configured for execution by the controller 524, for providing the digital signals specifying the bias voltage.

In some embodiments, the bias voltage provided by the power supply 522 may be adjusted in real time, during the imaging process, to allow dynamic adjustment of the imaging process.

Negatively biasing the contact 308 (or metal/substrate contact 212) degrades $MTF_{diffusion}$ and thus reduces or eliminates aliasing, with potentially little to no impact on the sensor full-well capacity. Negative biasing achieves this result by reducing the extent of the depletion region in the substrate 128: the more negative the bias, the smaller the depletion region and the larger the field-free region near the back surface of the substrate 128. Increasing the extent of the field-free region increases charge diffusion, which degrades $MTF_{diffusion}$. Negative biasing may be used in brightfield imaging to image as much light as possible on the sensor (e.g., using a UV or deep UV broadband light source) and to improve darkfield inspection performance by allowing the collection of high-angle scattering from small defects without aliasing.

Positively biasing the contact 308 (or metal/substrate contact 212) enhances $MTF_{diffusion}$ and thus allows multispectral imaging: an imaging sensor with a substrate 128 thick enough (e.g., 30 um thick) to support imaging at long wavelengths (e.g., red or infrared, where infrared may extend to 900 nm or more) can also be used to perform imaging at shorter wavelengths (e.g., blue, UV, or deep UV, where deep UV may be defined as 190 nm to 355 nm). In one example, the same imaging sensor may be used to perform imaging at 405 nm, 600 nm, and 900 nm. Positive biasing achieves this result by increasing the extent of the depletion region in the substrate 128: the more positive the bias, the larger the depletion region and the smaller the field-free region near the back surface of the substrate 128. Decreasing the extent of the field-free region decreases charge diffusion, which enhances $MTF_{diffusion}$.

The precise degree of depletion may be simulated for a specific pixel structure using known simulation software (e.g., 2-D simulation software from Silvaco, Inc.).

Figure 6:
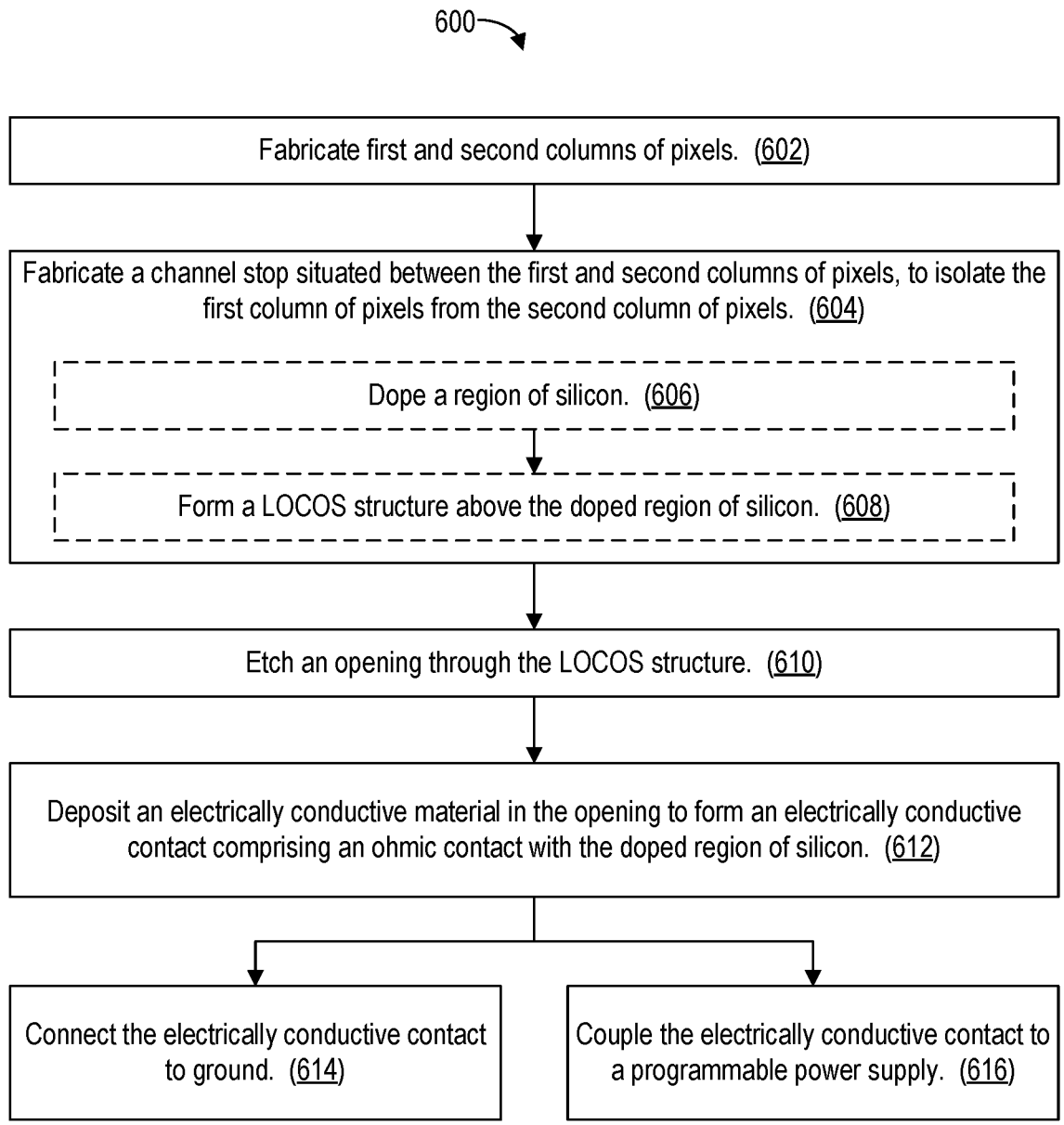
FIG. 6 is a flowchart showing a method of fabricating a back-illuminated image sensor, in accordance with some embodiments.

FIG. 6 is a flowchart showing a method 600 of fabricating a back-illuminated image sensor, in accordance with some embodiments. In the method 600, first and second columns of pixels (e.g., columns 101-1 and 101-2, FIG. 2, 3A, or 4) are fabricated (602). A channel stop (e.g., channel stop 202, FIGS. 2-4) situated between the first and second columns of pixels is also fabricated (604), to isolate the first column of pixels from the second column of pixels. To fabricate the channel stop, a region of silicon (e.g., region 126, FIG. 3B) is doped (606), for example using implantation, and a LOCOS structure (e.g., LOCOS 120, FIG. 3B) is formed (608) above the doped region of silicon. A portion of the doped region of silicon may be consumed in step 608 when forming the LOCOS structure.

An opening is etched (610) through the LOCOS structure. Electrically conductive material (e.g., aluminum) is deposited (612) in the opening to form an electrically conductive contact (e.g., metal/substrate contact 212, FIG. 2 or 4; contact 308; FIG. 3B) comprising an ohmic contact with the doped region of silicon.

In some embodiments, the electrically conductive contact is connected (614) to ground. For example, the electrically conductive contact is coupled to one or more ground pins of a sensor chip on which the structures of the method 600 are situated. In some embodiments, the electrically conductive contact is coupled (616) to a programmable power supply (e.g., power supply 522, FIG. 5B), which may be implemented on the sensor chip on which the structures of the method 600 are situated or on a separate chip.

Steps in the method 600 may be combined or broken out and steps that are not order-dependent may be reordered (e.g., in accordance with known semiconductor-processing techniques).

Figure 7:
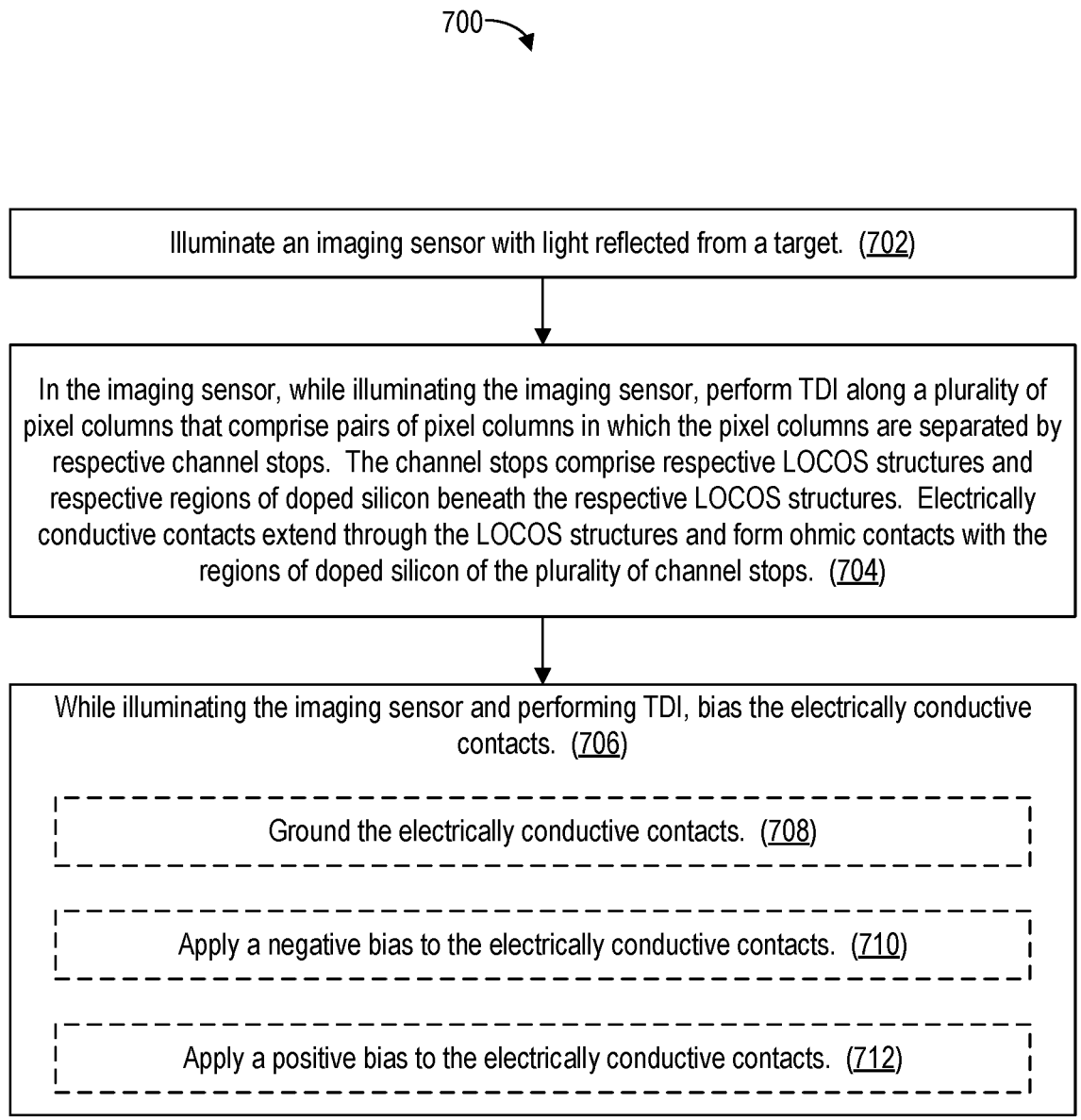
FIG. 7 is a flowchart showing a method of performing imaging, in accordance with some embodiments.

FIG. 7 is a flowchart showing a method 700 of performing imaging, in accordance with some embodiments. In the method 700, an imaging sensor (e.g., as fabricated per the method 600, FIG. 6) is illuminated (702) with light reflected from a target (e.g., a semiconductor wafer). In the imaging sensor, while illuminating the imaging sensor, time-domain integration (TDI) is performed (704) along a plurality of pixel columns that comprise pairs of pixel columns (e.g., columns 101-1 and 101-2, FIG. 2, 3A, or 4) in which the pixel columns are separated by respective channel stops (e.g., channel stops 202, FIGS. 2-4). The channel stops comprise respective LOCOS structures (e.g., LOCOS 120, FIG. 3B) and respective regions of doped silicon (e.g., regions 126, FIG. 3B) beneath the respective LOCOS structures. Electrically conductive contacts (e.g., metal/substrate contacts 212, FIG. 2 or 4; contacts 308; FIG. 3B) extend through the LOCOS structures and form ohmic contacts with the regions of doped silicon of the plurality of channel stops.

While illuminating the imaging sensor and performing TDI, the electrically conductive contacts are biased (706). In some embodiments, the electrically conductive contacts are biased by grounding them (708), as shown for example in FIG. 5A. In some embodiments, a negative bias (710) or positive bias (712) is applied to the electrically conductive contacts, as shown for example in FIG. 5B.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A back-illuminated image sensor, comprising:
   a first pixel comprising a first region of doped silicon situated directly adjacent to and between a gate oxide and a substrate, the first region having a first dopant type that is n-type or p-type;
   a second pixel comprising a second region of doped silicon situated directly adjacent to and between the gate oxide and the substrate, the second region having the first dopant type;
   a channel stop situated between the first pixel and the second pixel to isolate the first pixel from the second pixel, the channel stop comprising:
      a local oxidation of silicon (LOCOS) structure, and
      a third region of doped silicon beneath the LOCOS structure, the third region having a second dopant type that is p-type if the first dopant type is n-type and is n-type if the first dopant type is p-type; and
   a first electrically conductive contact extending through the LOCOS structure and forming an ohmic contact with the third region of doped silicon.

2. The image sensor of claim 1, wherein the first electrically conductive contact is connected to ground.

3. The image sensor of claim 1, further comprising a power supply electrically coupled to the first electrically conductive contact, wherein the power supply is configurable to negatively bias the first electrically conductive contact.

4. The image sensor of claim 1, further comprising a power supply electrically coupled to the first electrically conductive contact, wherein the power supply is configurable to both negatively and positively bias the first electrically conductive contact.

5. The image sensor of claim 1, wherein:
   the third region of doped silicon is a p++ implanted region; and
   the first and second regions of doped silicon are n-type.

6. The image sensor of claim 1, further comprising:
   a first column of pixels that includes the first pixel, wherein each pixel in the first column comprises a respective region of doped silicon situated directly adjacent to and between the gate oxide and the substrate and having the first dopant type; and
   a second column of pixels that includes the second pixel, wherein each pixel in the second column comprises a respective region of doped silicon situated directly adjacent to and between the gate oxide and the substrate and having the first dopant type;
   wherein the channel stop is situated between the first column and the second column to isolate the first column from the second column.

7. The image sensor of claim 6, further comprising a series of electrically conductive contacts, each extending through the LOCOS structure and forming a respective ohmic contact with the third region of doped silicon;
   wherein the series of electrically conductive contacts includes the first electrically conductive contact.

8. The image sensor of claim 6, wherein:
   the pixels in the first column and in the second column comprise respective pluralities of gates;
   respective gates of each plurality of gates are to receive respective clock signals of a plurality of clock signals; and
   each clock signal of the plurality of clock signals has a distinct phase.

9. The image sensor of claim 6, further comprising:
   a metal segment situated above the channel stop, wherein the first electrically conductive contact is between the metal segment and the third region of doped silicon;
   an electrically conductive polysilicon segment situated above the channel stop and overlapped by the metal segment; and
   a second electrically conductive contact between the metal segment and the polysilicon segment.

10. The image sensor of claim 6, further comprising an electrically conductive polysilicon line situated above the channel stop, extending along the channel stop, and in contact with the first electrically conductive contact.

11. The image sensor of claim 10, further comprising:
    a metal line situated above and extending along the polysilicon line and the channel stop; and
    a series of electrically conductive contacts between the metal line and the polysilicon line.

12. The image sensor of claim 6, wherein the first and second columns of pixels compose a first pair of pixel columns and the channel stop is a first channel stop, the image sensor further comprising:
    a plurality of pairs of pixel columns, including the first pair;
    a plurality of channel stops, including the first channel stop, each situated between the pixel columns of a respective pair of pixel columns to isolate the pixel columns of the respective pair of pixel columns, wherein each channel stop comprises a respective LOCOS structure and a respective region of doped silicon beneath the respective LOCOS structure; and
    a plurality of electrically conductive contacts, including the first electrically conductive contact, extending through the LOCOS structures and forming ohmic contacts with the regions of doped silicon of the plurality of channel stops.

13. The image sensor of claim 12, further comprising a metal line crossing above the plurality of pairs of pixel columns at a slant with respect to the plurality of pairs of pixels columns;
   wherein the plurality of electrically conductive contacts are between the metal line and the respective regions of doped silicon beneath respective LOCOS structures.

14. The image sensor of claim 1, further comprising a power supply electrically coupled to the first electrically conductive contact to provide a bias voltage to the first electrically conductive contact, the bias voltage being adjustable as a function of imaging wavelength, wherein:
   the image sensor is capable of performing imaging for a range of wavelengths including red and blue wavelengths; and
   the power supply is configured to positively bias the first electrically conductive contact for the blue wavelengths.

15. The image sensor of claim 14, wherein:
   the range of wavelengths includes ultraviolet (UV) wavelengths; and
   the power supply is configured to positively bias the first electrically conductive contact for the UV wavelengths.

16. The image sensor of claim 15, wherein the range of wavelengths further includes infrared (IR) wavelengths.

17. A method of fabricating a back-illuminated image sensor, comprising:
   fabricating a first column and a second column of pixels, comprising doping respective first regions of silicon for the pixels of the first column and respective second regions of silicon for the pixels of the second column to have a first dopant type that is n-type or p-type, the first regions and the second regions being situated directly adjacent to and between a gate oxide and a substrate;
   fabricating a channel stop situated between the first column and the second column of pixels, to isolate the first column of pixels from the second column of pixels, wherein fabricating the channel stop comprises:
      doping a third region of silicon to have a second dopant type that is p-type if the first dopant type is n-type and is n-type if the first dopant type is p-type, and forming a LOCOS structure above the third region of doped silicon;
      etching an opening through the LOCOS structure; and
      depositing electrically conductive material in the opening to form an electrically conductive contact comprising an ohmic contact with the third region of doped silicon.

18. The method of claim 17, further comprising connecting the electrically conductive contact to ground.

19. The method of claim 17, further comprising coupling the electrically conductive contact to a programmable power supply configurable to negatively bias the first electrically conductive contact.

20. An imaging method, comprising:
   illuminating an imaging sensor with light reflected from a target;
   in the imaging sensor, while illuminating the imaging sensor, performing time-domain integration (TDI) along a plurality of pixel columns comprising pairs of pixel columns, the pairs of pixel columns comprising respective first columns of pixels and respective second columns of pixels separated by respective channel stops, wherein:
      the pixels of the first columns comprise respective first regions of doped silicon situated directly adjacent to and between a gate oxide and a substrate, the first regions having a first dopant type that is n-type or p-type;
      the pixels of the second columns comprise respective second regions of doped silicon situated directly adjacent to and between the gate oxide and the substrate, the second regions having the first dopant type;
      the channel stops comprise respective LOCOS structures and respective third regions of doped silicon beneath the respective LOCOS structures, wherein the respective third regions of doped silicon beneath the respective LOCOS structures have a second dopant type that is p-type if the first dopant type is n-type and is n-type if the first dopant type is p-type; and
      electrically conductive contacts extend through the LOCOS structures and form ohmic contacts with the regions of doped silicon of the plurality of channel stops; and
   while illuminating the imaging sensor and performing TDI, biasing the electrically conductive contacts.

21. The method of claim 20, wherein biasing the electrically conductive contacts comprises grounding the electrically conductive contacts.

22. The method of claim 20, wherein biasing the electrically conductive contacts comprises applying a negative bias to the electrically conductive contacts.

23. The method of claim 20, wherein biasing the electrically conductive contacts comprises applying a positive bias to the electrically conductive contacts.

* * * * *